(12) United States Patent
Ha et al.

(10) Patent No.: US 12,297,526 B2
(45) Date of Patent: *May 13, 2025

(54) HYBRID MASK STICK AND MASK FRAME ASSEMBLY EMPLOYING THE SAME

(71) Applicant: Samsung Display Co., Ltd., Yongin-Si (KR)

(72) Inventors: Jaesoo Ha, Yongin-si (KR); Suhwan Lee, Yongin-si (KR); Sungho Seo, Yongin-si (KR); Kwangtae Yu, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,668

(22) Filed: Feb. 21, 2024

(65) Prior Publication Data

US 2024/0295019 A1  Sep. 5, 2024

Related U.S. Application Data

(62) Division of application No. 16/443,520, filed on Jun. 17, 2019, now Pat. No. 11,939,657.

(30) Foreign Application Priority Data

Sep. 12, 2018  (KR) ........................ 10-2018-0109178

(51) Int. Cl.
  *C23C 14/04*    (2006.01)
  *H10K 59/12*    (2023.01)
  (Continued)

(52) U.S. Cl.
  CPC ........... *C23C 14/042* (2013.01); *H10K 59/12* (2023.02); *H10K 71/00* (2023.02); *H10K 71/166* (2023.02)

(58) Field of Classification Search
  CPC ........................... C23C 14/042; C23C 16/042
  See application file for complete search history.

(56) References Cited

U.S. PATENT DOCUMENTS 3,323,490 A   6/1967  Mcgilliard
7,033,665 B2  4/2006  Yotsuya et al.
       (Continued)

FOREIGN PATENT DOCUMENTS

CN  106884140 A   6/2017
CN  206270648 U   6/2017
       (Continued)

OTHER PUBLICATIONS

Chinese Office Action corresponding to Application No. 201910546872.0 and issued on Nov. 3, 2022, 8 pages.

*Primary Examiner* — Aiden Lee
(74) *Attorney, Agent, or Firm* — Innovation Counsel LLP

(57) ABSTRACT

A hybrid mask stick and a mask frame assembly employing the same are provided. The mask frame assembly includes: a mask frame; and a mask stick assembly including a first mask stick that extends in a first direction, a second mask stick that extends in a second direction intersecting the first direction, and a plurality of third mask sticks that is coupled to ends of the first mask stick and the second mask stick and defines a plurality of deposition areas, wherein a thickness of the first mask stick is different from a thickness of the second mask stick, and a partial etching portion is arranged in a portion where the first mask stick and the second mask stick are coupled to each other.

7 Claims, 10 Drawing Sheets

(51) Int. Cl.
*H10K 71/00* (2023.01)
*H10K 71/16* (2023.01)

(56) References Cited

U.S. PATENT DOCUMENTS

| | | | |
|---|---|---|---|
| 8,550,032 | B2 | 10/2013 | Park |
| 9,909,204 | B2 | 3/2018 | Ma et al. |
| 10,437,144 | B2 | 10/2019 | Zhang |
| 11,970,763 | B2 * | 4/2024 | Lee ................. C23C 14/042 |
| 2008/0118743 | A1 | 5/2008 | Lee et al. |
| 2010/0224125 | A1 | 9/2010 | Lee et al. |
| 2011/0146573 | A1 | 6/2011 | Park |
| 2015/0026947 | A1 | 1/2015 | Han |
| 2015/0101536 | A1 | 4/2015 | Han |
| 2015/0159267 | A1 | 6/2015 | Ochi et al. |
| 2017/0141313 | A1 | 5/2017 | Min |

FOREIGN PATENT DOCUMENTS

| | | |
|---|---|---|
| CN | 107435130 A | 12/2017 |
| KR | 10-2004-0067929 A | 7/2004 |
| KR | 10-2008-0045886 A | 5/2008 |
| KR | 10-1107159 B1 | 1/2012 |
| KR | 10-2015-0036334 A | 4/2015 |
| KR | 10-2015-0042600 A | 4/2015 |
| KR | 10-2015-0071321 A | 6/2015 |
| KR | 10-2018-0038093 A | 4/2018 |

* cited by examiner

HYBRID MASK STICK AND MASK FRAME ASSEMBLY EMPLOYING THE SAME

CROSS-REFERENCE TO RELATED APPLICATION

This application is a divisional application of U.S. patent application Ser. No. 16/443,520 filed on Jun. 17, 2019, which claims priority under 35 USC § 119 to Korean Patent Application No. 10-2018-0109178, filed on Sep. 12, 2018, in the Korean Intellectual Property Office, the disclosures of which are incorporated herein in their entirety by reference.

BACKGROUND

1. Field

One or more embodiments of the present disclosure relate to a hybrid mask stick and a mask frame assembly employing the same.

2. Description of the Related Art

Various types of display devices are used in mobile devices such as smartphones, laptop computers, digital cameras, camcorders, personal digital assistants, notebook computers, and tablet personal computers, or in electronic apparatuses such as desktop computers, televisions, outdoor billboards, display devices for exhibitions, instrument panels for automobiles, and head-up displays (HUDs).

Various manufacturing processes are employed to form a thin layer over a substrate in a display device. One of the most commonly employed manufacturing processes is deposition in which a deposition material is deposited on a substrate by using a mask. Such a mask may include a pattern mask in which a plurality of pattern holes for depositing an emission layer is arranged and an open mask that does not require pattern holes. The open mask includes an opening for depositing a common layer.

For convenience of manufacturing, a large scale mask may be used for an open mask to simultaneously manufacture display devices having various sizes. The open mask may be welded onto a mask frame with a predetermined amount of tensile force.

SUMMARY

In the case where a large scale mask including a plurality of mask sticks is coupled to one another, deformation of a mask stick may occur at a portion where the plurality of mask sticks is coupled to one another.

One or more embodiments include a hybrid mask stick that may prevent deformation of a portion at which a plurality of mask sticks is coupled to one another, and a mask frame assembly employing the hybrid mask stick.

Additional aspects of the present disclosure will be set forth in part in the following written description and, in part, will be apparent from the following written description, or may be learned by practice of the presented embodiments.

According to one or more embodiments, a mask frame assembly includes: a mask frame including an opening; and a mask stick assembly arranged on the mask frame and including at least one first mask stick that extends in a first direction, at least one second mask stick that extends in a second direction intersecting the first direction, and a plurality of third mask sticks that is coupled to ends of each of the at least one first mask stick and the at least one second mask stick and defines a plurality of deposition areas, wherein a thickness of each of the at least one first mask stick is different from a thickness of each of the at least one second mask stick, and a partial etching portion is arranged in a portion where the at least one first mask stick and the at least one second mask stick are coupled to each other.

The partial etching portion may be arranged in each of the at least one first mask stick at a portion where each of the at least one second mask stick is respectively mounted, and the partial etching portion of the at least one first mask stick may have a thickness that is smaller than a thickness of other portions of the at least one first mask stick.

A depth of the partial etching portion may be the same as a thickness of the second mask stick.

A length of the partial etching portion may be smaller than a width of each of the at least one first mask stick in the second direction.

Each of the at least one first mask stick may have a thickness that is greater than a thickness of each of the at least one second mask stick.

A width of the at least one second mask stick may be uniform along a length direction of the at least one second mask stick.

A width of an end of each the at least one second mask stick that is mounted on the partial etching portion may be greater than a width of other portions of the at least one second mask stick.

The second mask stick may be welded onto the first mask stick, and welding points may be arranged along an edge of each of the at least one second mask stick over the partial etching portion.

Each of the at least one first mask stick may include a first stick member and a second stick member that is arranged on and overlaps the first stick member, and the partial etching portion may be arranged in a portion where the second stick member and the at least one second mask stick may be coupled to each other.

The first stick member may be a stick member that is coupled to the at least one second mask stick, the second stick member may be a stick member that defines the plurality of deposition areas, and a thickness of the first stick member may be greater than a thickness of the second stick member.

The partial etching portion may include: a first partial etching portion arranged in the second stick member and having a thickness that is smaller than a thickness of other portions of the second stick member; and a second partial etching portion arranged in each of the at least one second mask stick and having a thickness that is smaller than a thickness of other portions of the at least one second mask stick, wherein the first partial etching portion and the second partial etching portion may have shapes corresponding to each other and may be coupled to each other in a third direction intersecting the first direction and the second direction.

A sum of a thickness of the first partial etching portion and a thickness of the second partial etching portion may be same as a thickness of other portions of the second stick member.

A width of the second stick member may be greater than a width of the first stick member.

The second mask stick may be welded onto the first stick member, and the second stick member may be welded onto the at least one second mask stick.

Each of two opposite ends of each of the at least one first mask stick may be coupled to at least two different third mask sticks among the plurality of third mask sticks, a first end of each of the at least one second mask stick may be coupled to each of the at least one first mask stick, and a second end of each of the at least one second mask stick may be coupled to one of the plurality of third mask sticks.

The plurality of third mask sticks may include a plurality of stick portions, and the plurality of stick portions may be coupled to one another to form a quadrangular shape.

The plurality of deposition areas may be respectively arranged in spaces partitioned by connecting the at least one first mask stick, the at least one second mask stick, and the third mask sticks to one another, and each of the plurality of deposition areas may correspond to a single opening through which to deposit a common layer over patterned adjacent pixel regions of a display panel.

According to one or more embodiments, a hybrid mask stick includes: at least one first mask stick that extends in a first direction; at least one second mask stick that extends in a second direction intersecting the first direction; and a plurality of third mask sticks coupled to ends of the at least one first mask stick and the at least one second mask stick, wherein the at least one first mask stick, the at least one second mask stick, and the plurality of third mask sticks may be coupled to one another and define a plurality of deposition areas corresponding to each of a plurality of display panels, and a partial etching portion may be arranged in a portion where the at least one first mask stick and the at least one second mask stick are coupled to each other.

The partial etching portion may be arranged in a portion of each of the at least one first mask stick on which each of the at least one second mask stick is respectively mounted, a thickness of the partial etching portion may be smaller than a thickness of other portions of the at least one first mask stick, and a thickness of each of the at least one first mask stick may be greater than a thickness of the at least one second mask stick.

Each of the at least one first mask stick may include a first stick member and a second stick member that is arranged on the first stick member, the partial etching portion may be arranged in a portion where the second stick member and the at least one second mask stick are coupled to each other, and a thickness of the second stick member may be smaller than a thickness of the first stick member.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
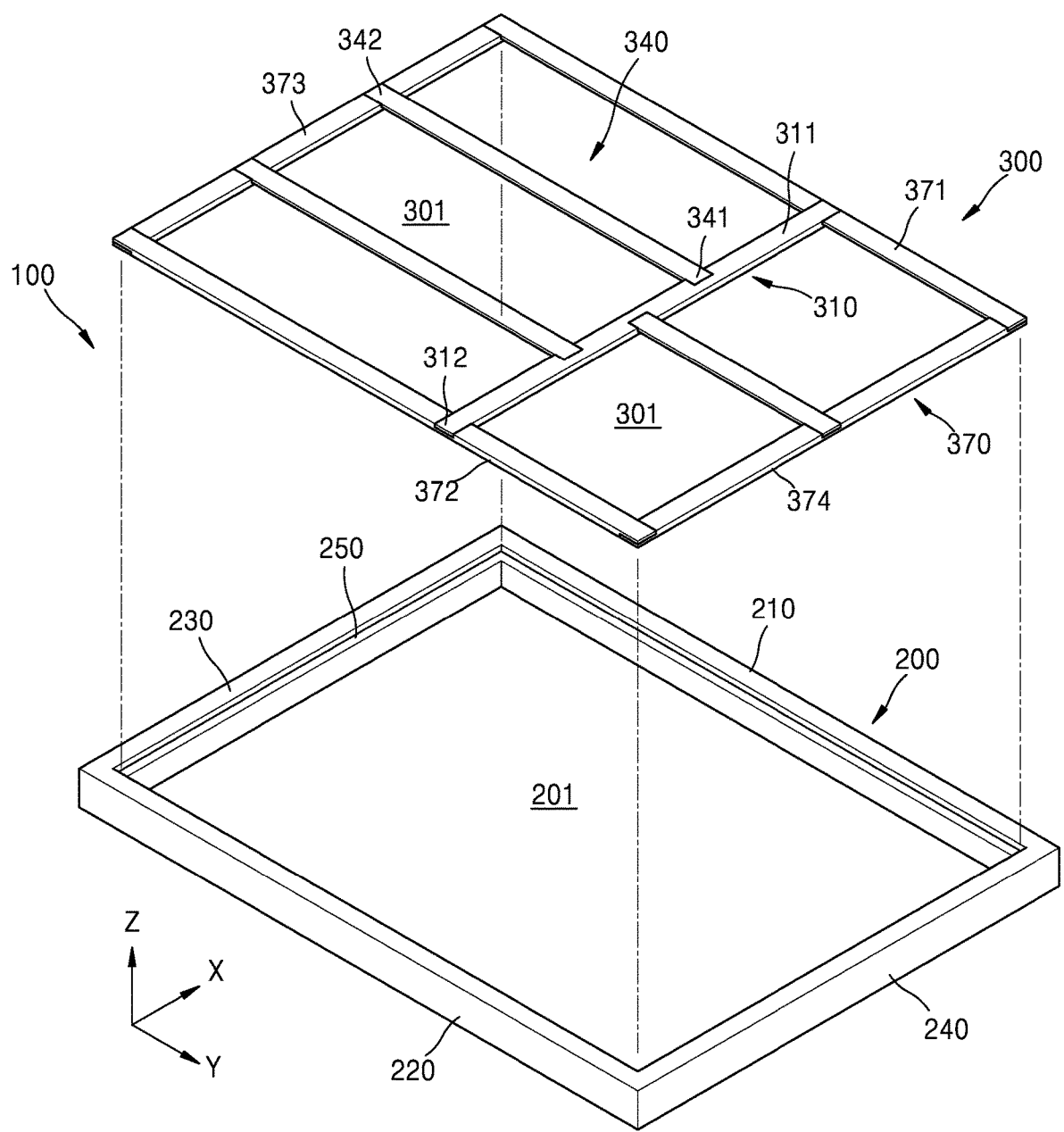
FIG. 1 is a perspective view of a mask frame assembly according to an embodiment.

As the disclosure allows for various changes and numerous embodiments, example embodiments of the present disclosure will be illustrated in the drawings and described in detail in the written description. An effect and a characteristic of the present disclosure, and a method of accomplishing them will be apparent when referring to the embodiments described with reference to the drawings. The present disclosure may, however, be embodied in many different forms and should not be construed as limited to the example embodiments set forth herein.

Sizes of elements shown in the drawings may be exaggerated for convenience of explanation. In other words, since sizes and thicknesses of components shown in the drawings are arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent directions that are not perpendicular to one another.

Hereinafter, a hybrid mask stick and a mask frame assembly employing the same according to various embodiments are described in detail with reference to the accompanying drawings. In making descriptions with reference to the accompanying drawings, like reference numerals are used to represent like or corresponding elements and repeated descriptions thereof may be omitted.

Figure 2:
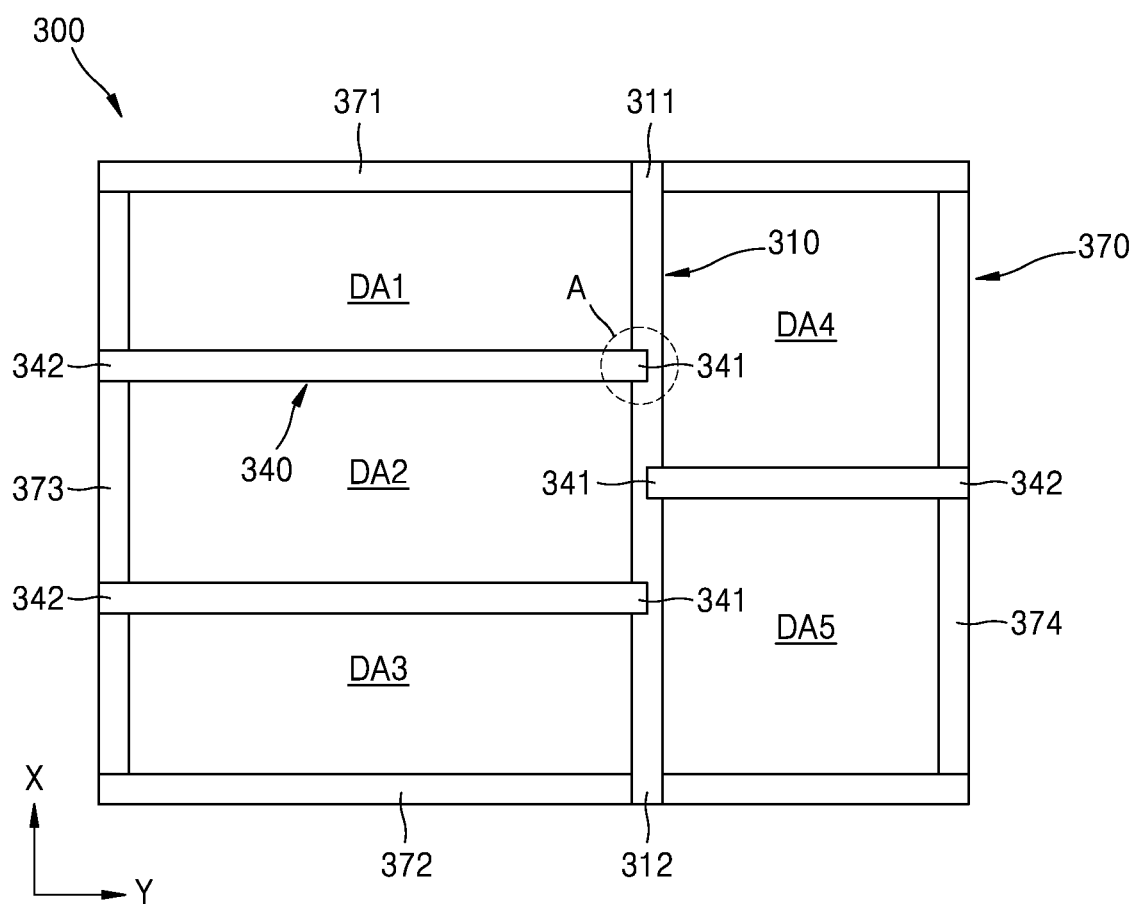
FIG. 2 is a plan view of a mask stick assembly of FIG. 1.
Figure 3A:
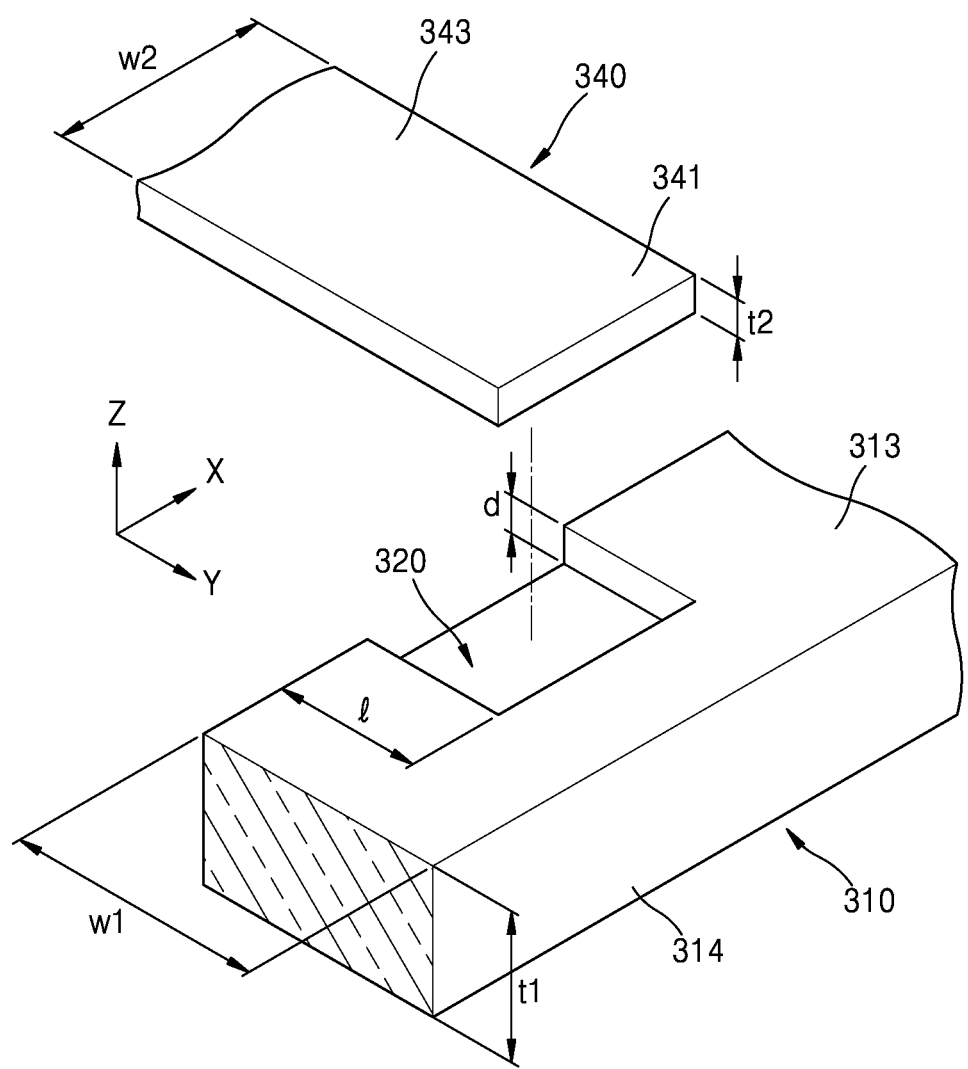
FIG. 3A is an enlarged exploded perspective view of a partially cut portion A of FIG. 2.
Figure 3B:
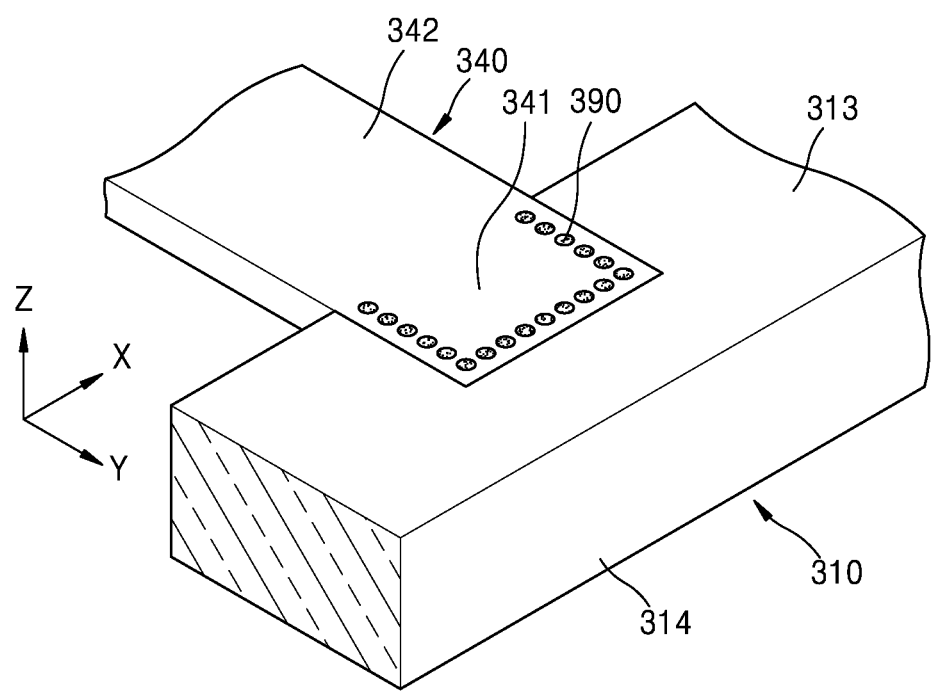
FIG. 3B is a perspective view of a coupled state of the mask stick assembly of FIG. 3A.

FIG. 1 is a perspective view of a mask frame assembly 100 according to an embodiment, FIG. 2 is a plan view of a mask stick assembly 300 of FIG. 1, FIG. 3A is an enlarged exploded perspective view of a partially cut portion A of FIG. 2, and FIG. 3B is a perspective view of a coupled state of the mask stick assembly 300 of FIG. 3A.

Referring to FIGS. 1, 2, 3A, and 3B, the mask frame assembly 100 includes a mask frame 200 and the mask stick assembly 300 that are mounted on the mask frame 200. FIG. 1 shows an exploded view of the mask frame assembly in which the mask frame 200 and the mask stick assembly 300 are separated from each other.

An opening 201 may be formed in the mask frame 200. The opening 201 may be surrounded by a plurality of frames 210, 220, 230, and 240 provided to the mask frame 200. The plurality of frames 210, 220, 230, and 240 may be coupled to one another.

The plurality of frames 210, 220, 230, and 240 includes the first frame 210 and the second frame 220 that face each other in a first direction (X-direction), and the third frame 230 and the fourth frame 240 that face each other in a second direction (Y-direction). The first frame 210, the second frame 220, the third frame 230, and the fourth frame 240 may be coupled to one another to form a quadrangular frame. A seating member 250 in which each of the mask stick assembly 300 is mounted may be arranged in each of the plurality of frames 210, 220, 230, and 240. The seating member 250 may provide a step difference to stably seat the mask stick assembly 300.

The mask frame 200 may include a material that is resistant to deformation while the mask stick assembly 300 is welded, for example, metal having a high modulus of rigidity. In an embodiment, a thickness of the mask frame 200 in the third direction (Z-direction) may be about 50 mm.

The mask stick assembly 300 may be coupled on the mask frame 200. The mask stick assembly 300 may be a thin plate. The mask stick assembly 300 may include one of stainless steel, invar, nickel (Ni), cobalt (Co), a nickel alloy, and a Ni—Co alloy.

The mask stick assembly 300 includes a plurality of separated mask sticks. The mask stick assembly 300 includes at least one first mask stick 310, at least one second mask stick 340, and a plurality of third mask sticks 370. The mask stick assembly 300 may be a hybrid type mask stick assembly that may be used to simultaneously deposit a deposition material on a plurality of display panels having different sizes. Herein, the term "hybrid type" indicates that the mask stick assembly 300 can be used to create multiple deposition areas of different sizes.

The first mask stick 310 may extend in the first direction (X-direction). The first direction (X-direction) may correspond to a lengthwise direction of the first mask stick 310. At least one first mask stick 310 may be provided.

The second mask stick 340 may extend in the second direction (Y-direction). The second direction (Y-direction) may correspond to a lengthwise direction of the second mask stick 340. The second direction may be a direction that crosses the first direction (X-direction) in a horizontal direction of the mask stick assembly 300. At least one second mask stick 340 may be provided. In an embodiment, the mask stick assembly 300 includes three second mask sticks 340.

The plurality of third mask sticks 370 includes a first stick member 371 and a second stick member 372 facing each other in the first direction (X-direction) and extending in the second direction (Y-direction), and a third stick member 373 and a fourth stick member 374 facing each other in the second direction (Y-direction) and extending in the first direction (X-direction). The first stick member 371, the second stick member 372, the third stick member 373, and the fourth stick member 374 may be coupled to one another to form a quadrangular frame. The plurality of third mask sticks 370 may be mounted on the seating member 250 formed in each of the plurality of frames 210, 220, 230, and 240.

The first mask stick 310, the second mask stick 340, and the plurality of third mask sticks 370 may be coupled to one another to define a plurality of deposition areas DA1, DA2, DA3, DA4, and DA5. Each of the plurality of deposition areas DA1, DA2, DA3, DA4, and DA5 may correspond to a single opening 301 through which a common layer is deposited over patterned adjacent pixel regions of a corresponding display panel, for example, a common electrode or a portion of an intermediate layer of an organic light-emitting diode OLED.

The plurality of deposition areas DA1, DA2, DA3, DA4, and DA5 may have different sizes. For example, the first deposition area DA1, the second deposition area DA2, and the third deposition area DA3 have the same size, and the fourth deposition area DA4 and the fifth deposition area DA5 have the same size. The first deposition area DA1, the second deposition area DA2, and the third deposition area DA3 may have a size that is different from a size of the fourth deposition area DA4 and the fifth deposition area DA5. A deposition material may pass through the single opening 301 arranged in each of the plurality of deposition areas DA1, DA2, DA3, DA4, and DA5 and may be deposited on the corresponding display panels.

The plurality of deposition areas DA1, DA2, DA3, DA4, and DA5 may be arranged in each of the areas partitioned by the first mask stick 310, the second mask stick 340, and the plurality of third mask sticks 370 that are coupled with one another. Specifically, a first end 311 of the first mask stick 310 may be coupled to the first stick member 371, and a second end 312 of the first mask stick 310 may be coupled to the second stick member 372. A first end 341 of the second mask stick 340 may be coupled to the first mask stick 310, and a second end 342 of the second mask stick 340 may be coupled to the third stick member 373 or the fourth stick member 374. As described above, the first mask stick 310, the second mask stick 340, and the plurality of third mask sticks 370 may be coupled with one another to define the plurality of deposition areas DA1, DA2, DA3, DA4, and DA5.

In this case, the two opposite ends 341 and 342 of the second mask stick 340 may be respectively welded onto the first mask stick 310 and the plurality of third mask sticks 370 with a predetermined amount of downward force exerted by a tip of a welding machine, resultantly causing tensile force in the second direction (Y-direction). The tensile force may be exerted by a separate tensioner (not shown).

In an embodiment, a length of the first mask stick 310 may be greater than a length of the second mask stick 340. The plurality of second mask sticks 340 may be welded onto the first mask stick 310 and the third stick member 373 (or the fourth stick member 374) such that the plurality of second mask sticks 340 is spaced apart from one another in a length direction (X-direction) of the first mask stick 310. During the welding, due to the tensile force transferred from the second mask stick 340, the first mask stick 310 may be deformed or warped. If the first mask stick 310 is deformed or warped, the plurality of deposition areas DA1, DA2, DA3, DA4, and DA5 cannot be accurately defined.

Referring to FIG. 3A, a thickness t1 of the first mask stick 310 may be different from a thickness t2 of the second mask stick 340 to prevent deformation of a portion where the first mask stick 310 is coupled to the second mask stick 340. Specifically, the thickness t1 of the first mask stick 310 may be greater than the thickness t2 of the second mask stick 340.

In an embodiment, the thickness t1 of the first mask stick 310 may be about 200 μm to about 500 μm. The thickness t2 of the second mask stick 340 may be about 20 μm to about 50 μm. During the tensile welding process, deformation of the first mask stick 310 may be suppressed because the thickness t1 of the first mask stick 310 is relatively greater than the thickness t2 of the second mask stick 340.

The two opposite ends 311 and 312 of the first mask stick 310 may be welded onto the first stick member 371 and the second stick member 372 of the plurality of third mask sticks 370 with a predetermined amount of downward force exerted by a tip of a welding machine, resultantly causing tensile force applied in the first direction (X-direction). The first mask stick 310 may have the thickness t1 that may prevent the first mask stick 310 from being sagged down due to the applied tensile force during the tensile welding process.

Meanwhile, since the plurality of third mask sticks 370 is welded onto the mask frame 200 that has a thickness that is tens of times to hundreds of times greater (e.g., 50 mm) than a thickness of the mask stick assembly 300 (e.g., 200 μm to 500 μm), the amount of deformation of portions of the plurality of frames 210, 220, 230, and 240 to which the first mask stick 310 and/or the second mask stick 340 are connected may be negligible.

A shape or structure of the plurality of third mask sticks 370 may change variously depending on a shape or structure of an end of the first mask stick 310 and the second mask stick 340. The plurality of third mask sticks 370 is not limited to a particular shape or structure as far as a surface of the plurality of third mask sticks 370 that contacts a substrate and surfaces of the first mask stick 310 and the second mask stick 340 that contacts the substrate have a common horizontal surface.

Meanwhile, when the second mask stick 340 is tension-welded onto the first mask stick 310, a step difference may occur between the first mask stick 310 and the second mask stick 340. Therefore, during a deposition process, a shadow may occur in the deposition areas DA1, DA2, DA3, DA4, and DA5 of the plurality of display panels. To prevent the shadow, a partial etching portion 320 may be arranged at a portion where the second mask stick 340 is welded onto the first mask stick 310.

Specifically, the partial etching portion 320 may be arranged in a corresponding portion of the first mask stick 310 on which the first end 341 of the second mask stick 340 is mounted by welding. The partial etching portion 320 may correspond to a portion of the first mask stick 310 that has a thickness less than the thickness t1 of other portions of the first mask stick 310.

The partial etching portion 320 may correspond to an area that has been formed by etching the first mask stick 310 in a third direction (Z-direction) that crosses the first direction (X-direction) and the second direction (Y-direction) from a surface 313 of the first mask stick 310. The third direction (Z-direction) may be a thickness direction of the first mask stick 310.

A depth d of the partial etching portion 320 may be the same as the thickness t2 of the second mask stick 340. Since the first end 341 of the second mask stick 340 is mounted onto the partial etching portion 320, a step difference may not occur between the first mask stick 310 and the second mask stick 340. That is, the surface 313 of the first mask stick 310 and a surface 343 of the second mask stick 340 may be the same horizontal surface. In an embodiment, a width w2 of the second mask stick 340 may be uniform along the length direction of the second mask stick 340.

The first mask stick 310 may be coupled with the second mask stick 340 by laser welding. Specifically, a predetermined amount of tensile force may be applied to the second mask stick 340 in the second direction (Y-direction) during the laser welding process. In this case, the first end 341 of the second mask stick 340 may be mounted on the partial etching portion 320. Next, the welding process is performed by irradiating a laser beam from above onto the second mask stick 340. Referring to FIG. 3B, welding points 390 may be arranged along an edge of the first end 341 of the second mask stick 340 over the partial etching portion 320.

A sagging degree of the second mask stick 340 may change depending on a location of the first mask stick 310 onto which the second mask stick 340 is welded. The first mask stick 310 may be also adversely affected depending on the sagging degree of the second mask stick 340.

For example, in the case where the first end 341 of the second mask stick 340 extends to an outer edge 314 of the first mask stick 310, during the welding process, stress is concentrated around the outer edge 314 of the first mask stick 310. As a result, the first end 341 of the second mask stick 340 may be exfoliated from the first mask stick 310.

To prevent the exfoliation of the second mask stick 340 from the first mask stick 310, a length l of the partial etching portion 320 may be less than a width w1 of the first mask stick 310 in the second direction (Y-direction). Therefore, the first end 341 of the second mask stick 340 mounted on the partial etching portion 320 may not extend to the outer edge 314 of the first mask stick 310. For example, the first end 341 of the second mask stick 340 may extend to a central portion of the first mask stick 310. When a welding process is performed with the first end 341 of the second mask stick 340 extended to the central portion of the first mask stick 310, deformation of the second mask stick 340 may be suppressed while the second mask stick 340 is securely coupled to the first mask stick 310.

Hereinafter, a characteristic of a portion where the first mask stick 310 is coupled with the second mask stick 340 according to an embodiment is extracted and described. Designs and configurations of the plurality of third mask sticks 370 as being coupled to the first mask stick 310 and the second mask stick 340 and defining a plurality of deposition areas may be easily changed depending on a coupling structure to the first mask stick 310 and the second mask stick 340, description thereof is omitted.

Figure 4A:
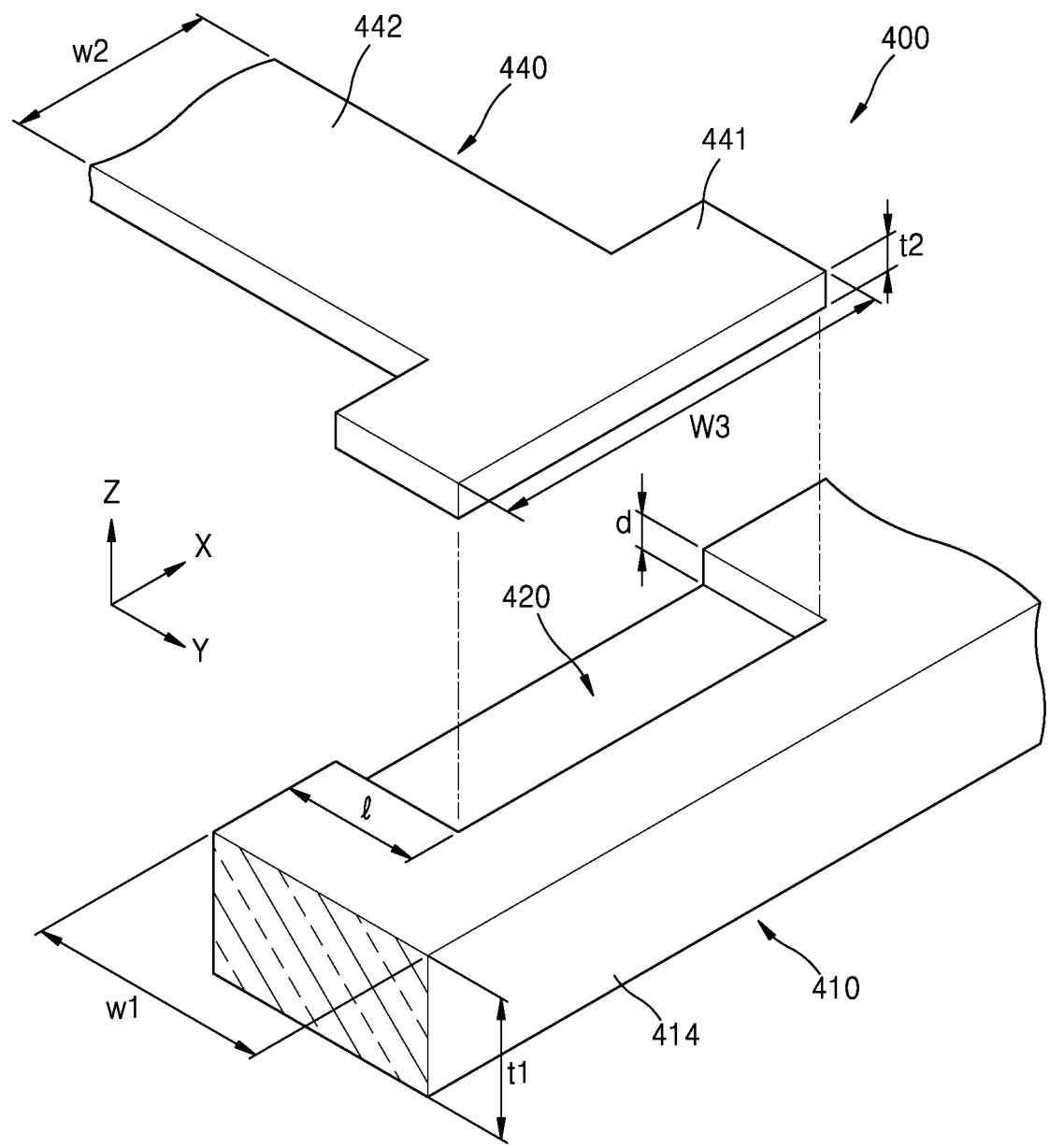
FIG. 4A is an enlarged exploded perspective view of a partially cut mask stick assembly according to another embodiment.
Figure 4B:
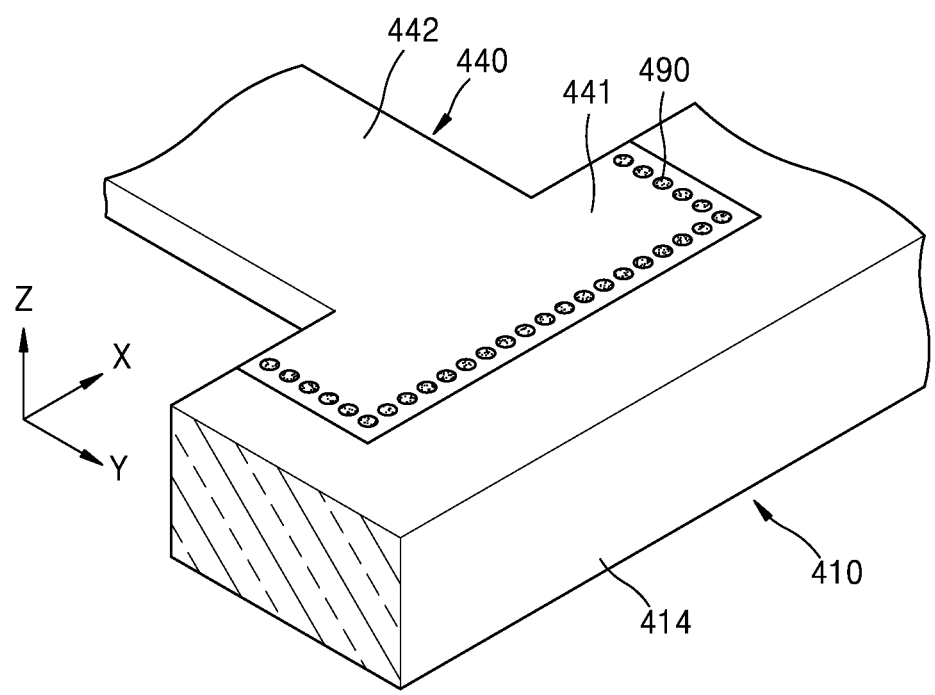
FIG. 4B is a perspective view of a coupled state of the mask stick assembly of FIG. 4A.

FIG. 4A is an enlarged exploded perspective view of a partially cut mask stick assembly 400 according to another embodiment, and FIG. 4B is a perspective view of a coupled state of the mask stick assembly 400 of FIG. 4A.

Referring to FIGS. 4A and 4B, the mask stick assembly 400 includes a first mask stick 410 and a second mask stick 440. A thickness t1 of the first mask stick 410 may be greater than a thickness t2 of the second mask stick 440. A partial etching portion 420 may be arranged in a corresponding portion of the first mask stick 410 on which a first end 441 of the second mask stick 440 is mounted. A depth d of the partial etching portion 420 may be the same as the thickness t2 of the second mask stick 440.

A length l of the partial etching portion 420 may be less than a width w1 of the first mask stick 410 in the second direction (Y-direction). The first end 441 of the second mask stick 440 that is mounted on the partial etching portion 420 may not extend to an outer edge 414 of the first mask stick 410.

To reduce the tensile force transferred to the first mask stick 410 from the second mask stick 440, a width of the second mask stick 440 may not be uniform. Specifically, a main body 442 of the second mask stick 440 may have a first width w2, and the first end 441 extending from the main body 442 may have a second width w3. The second width w3 may be greater than the first width w2. Since the second width w3 of the first end 441 is wider than the first width w2, the tensile force transferred from the second mask stock 440 to the first mask stick 410 may be distributed over a larger portion of the first mask stick 410. As a result, deformation of the first mask stick 410 may be further suppressed.

The first mask stick 410 may be coupled with the second mask stick 440 by laser welding. Referring to FIG. 4B, welding points 490 may be arranged along an edge of the first end 441 of the second mask stick 440 over the partial etching portion 420.

As described above, the thickness t1 of the first mask stick 310 (or 410) may be relatively greater than the thickness t2 of the second mask stick 340 (or 440). Therefore, during or after the second mask stick 340 (440) is tensile-welded onto the first mask stick 310 (410), deformation of the first mask stick 310 (410) may be suppressed.

In an embodiment, to further suppress the deformation of the first mask stick 310 (or 410), the first mask stick 310 (or 410) may include a stick member of a multi-layer.

Figure 5A:
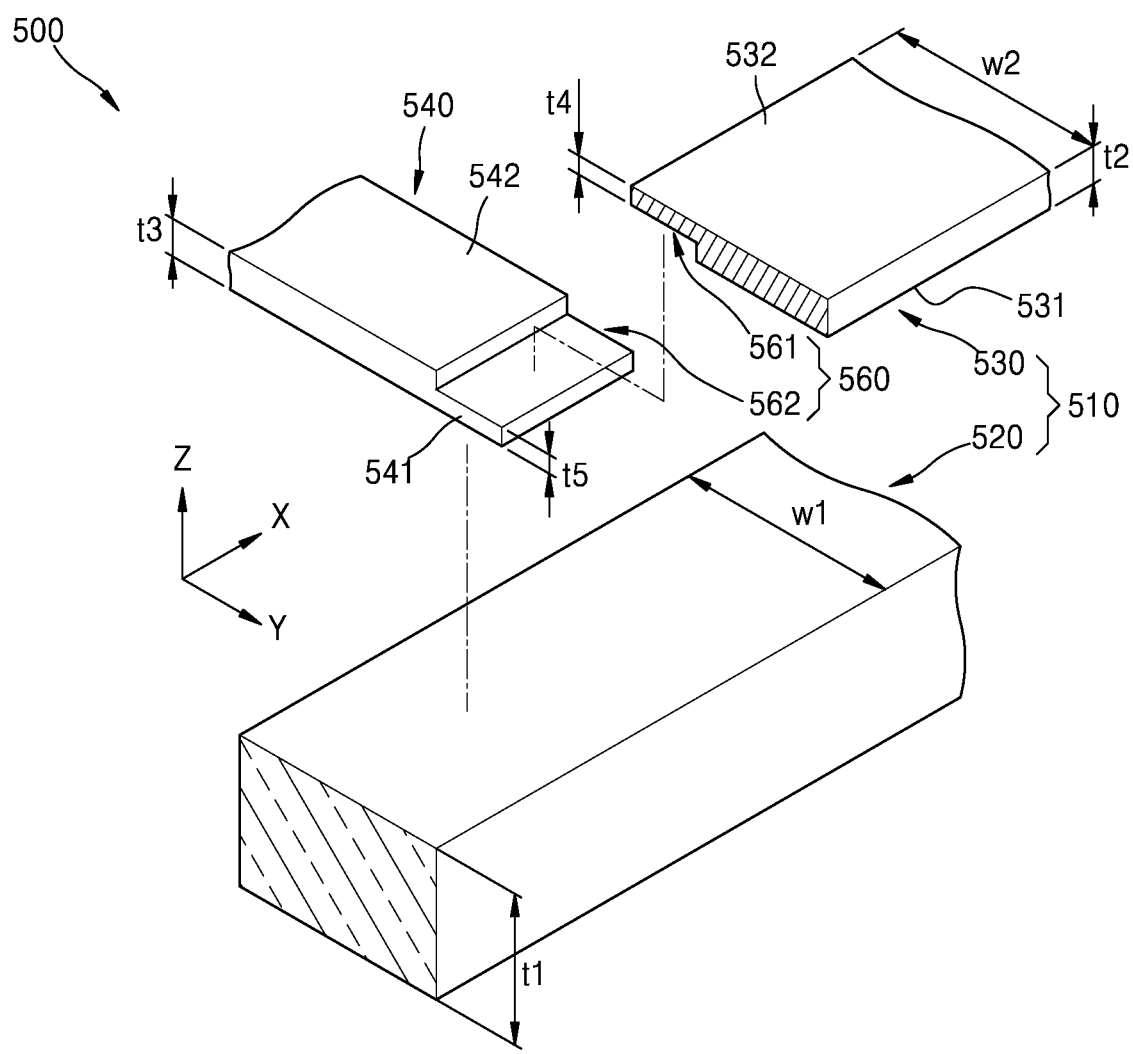
FIG. 5A is an enlarged exploded perspective view of a partially cut mask stick assembly according to another embodiment.
Figure 5B:
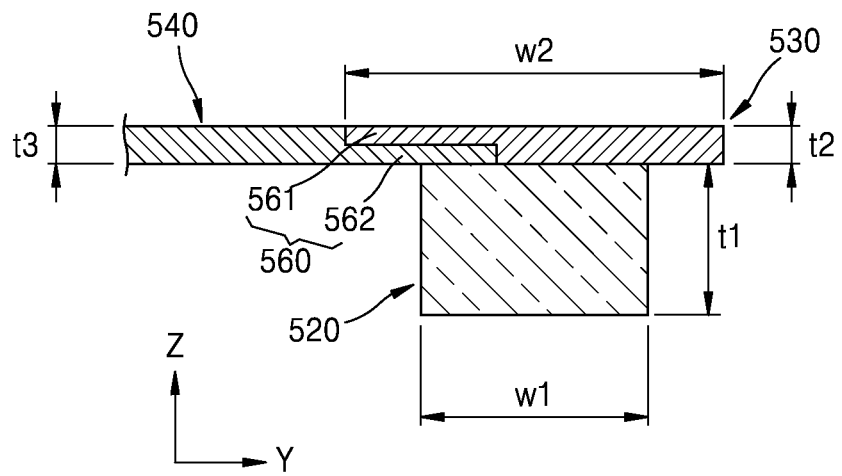
FIG. 5B is a cross-sectional view of a coupled state of the mask stick assembly of FIG. 5A.
Figure 5C:
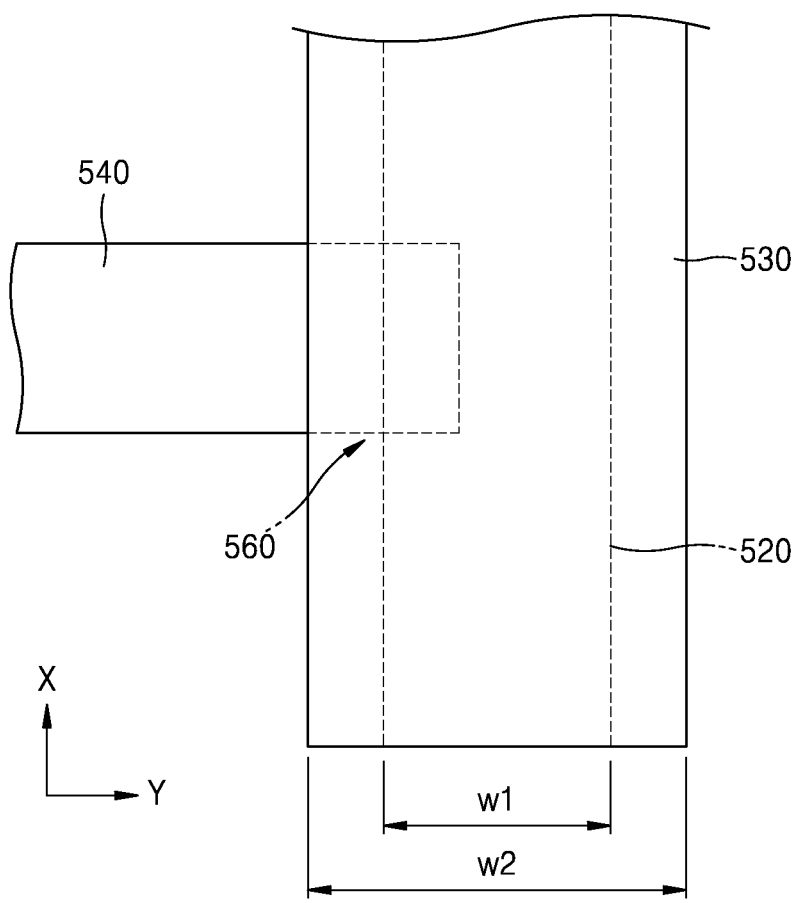
FIG. 5C is a plan view of the mask stick assembly of FIG. 5B.

FIG. 5A is an enlarged exploded perspective view of a partially cut mask stick assembly 500 according to another embodiment, FIG. 5B is a cross-sectional view of a coupled state of the mask stick assembly 500 of FIG. 5A, and FIG. 5C is a plan view of the mask stick assembly 500 of FIG. 5B.

Referring to FIGS. 5A, 5B, and 5C, the mask stick assembly 500 includes a first mask stick 510 and a second mask stick 540. The first mask stick 510 includes a first stick member 520 and a second stick member 530 that is arranged on the first stick member 520. The first stick member 520 and the second stick member 530 may extend in the first direction (X-direction). The first stick member 520 may be a stick member that is coupled to the second mask stick 540. The second stick member 530 may be a stick member that is configured to define a plurality of deposition areas (e.g., the plurality of deposition areas DA1, DA2, DA3, DA4, and DA5 of FIG. 2).

The first stick member 520 may overlap the second stick member 530 in the third direction (Z-direction). A thickness t1 of the first stick member 520 may be different from a thickness t2 of the second stick member 530. For example, the thickness t1 of the first stick member 520 may be greater than the thickness t2 of the second stick member 530. The thickness t2 of the second stick member 530 may be the same as a thickness t3 of the second mask stick 540. In an embodiment, the thickness t1 of the first stick member 520 may be about 200 μm to about 500 μm. The thickness t2 of the second stick member 530 and the thickness t3 of the second mask stick 540 may be about 20 μm to about 50 μm.

The second mask stick 540 may be welded onto the first stick member 520 that has a relatively thick thickness. Since the thickness t1 of the first stick member 520 is much greater than the thickness t2 of the second stick member 530, deformation of the first stick member 520 may be suppressed during and after the second mask stick 540 is welded onto the first stick member 520.

The second mask stick 540 may be welded onto the first stick member 520, and the second stick member 530 may be welded onto the second mask stick 540. In this case, due to a step difference may occur between the second stick member 530 and the second mask stick 540, shadows may occur in the deposition areas DA1, DA2, DA3, DA4, and DA5 of a plurality of display panels.

Referring to FIG. 5B, a partial etching portion 560 may be arranged on a portion where the second stick member 530 is coupled to the second mask stick 540 to prevent the shadows. Specifically, the partial etching portion 560 includes a first partial etching portion 561 that is arranged in the second stick member 530, and a second partial etching portion 562 that is arranged in the second mask stick 540.

The first partial etching portion 561 of the second stick member 530 may be arranged in a corresponding portion of the second stick member 530 on which a first end 541 of the second mask stick 540 is mounted. The first partial etching portion 561 may correspond to a portion of the second stick member 530 that has a thickness t4 that is smaller than the thickness t2 of other portions of the second stick member 530. For example, the first partial etching portion 561 may correspond to a portion of the second stick member 530 that has the thickness t4, which is smaller than the thickness of other portions of the second stick member 530 in the third direction (Z-direction). The third direction is a perpendicular direction from a bottom surface 531 of the second stick member 530 that faces the first stick member 520.

The second partial etching portion 562 may be arranged in the first end 541 of the second mask stick 540. The second partial etching portion 562 may correspond to a portion of the second mask stick 540 that has a thickness t5, which is smaller than the thickness t3 of other portions of the second mask stick 540. For example, the second partial etching portion 562 may correspond to a portion of the second mask stick 540 that has the thickness t5, which is smaller than the thickness t3 of other portions of the second mask stick 540 in the third direction (Z-direction). The third direction is a perpendicular direction from a top surface 542 of the second mask stick 540.

The first partial etching portion 561 and the second partial etching portion 562 may have shapes corresponding to each other. The first partial etching portion 561 may be coupled to the second partial etching portion 562 in the third direction (Z-direction) by welding. A sum of the thicknesses (t4+t5) at a portion where the first partial etching portion 561 is coupled to the second partial etching portion 562 may be the same as the thickness t2 of other portions of the second stick member 530 except the first partial etching portion 561 and/or the thickness t3 of other portions of the second mask stick 540 except the second partial etching portion 562. Since the second stick member 530 is coupled to the second mask stick 540 at the portion where the partial etching portion 560 is formed, a step difference does not occur between the second stick member 530 and the second mask stick 540.

Meanwhile, a substrate (not shown) may contact a top surface 532 of the second stick member 530 and a top surface 542 of the second mask stick 540. The width w2 of the second stick member 530 that defines the plurality of deposition areas DA1, DA2, DA3, DA4, and DA5 may be greater than the width w1 of the first stick member 520 that is coupled to the second mask stick 540. In an embodiment, the width w1 of the first stick member 520 may be about 46 mm, and the width w2 of the second stick member 530 may be about 52 mm.

As described above, the thickness t1 of the first stick member 520 may be greater than the thickness t2 of the second stick member 530, and the width w1 of the first stick member 520 may be smaller than the width w2 of the second stick member 530. Even if the first stick member 520 is twisted during or after the welding process, the first stick member 520 may be secured with a sufficient margin because the width w1 of the first stick member 520 is smaller than the width w2 of the second stick member 530 that defines the plurality of deposition areas DA1, DA2, DA3, DA4, and DA5. As a result, a shadow phenomenon may be prevented.

Figure 6:
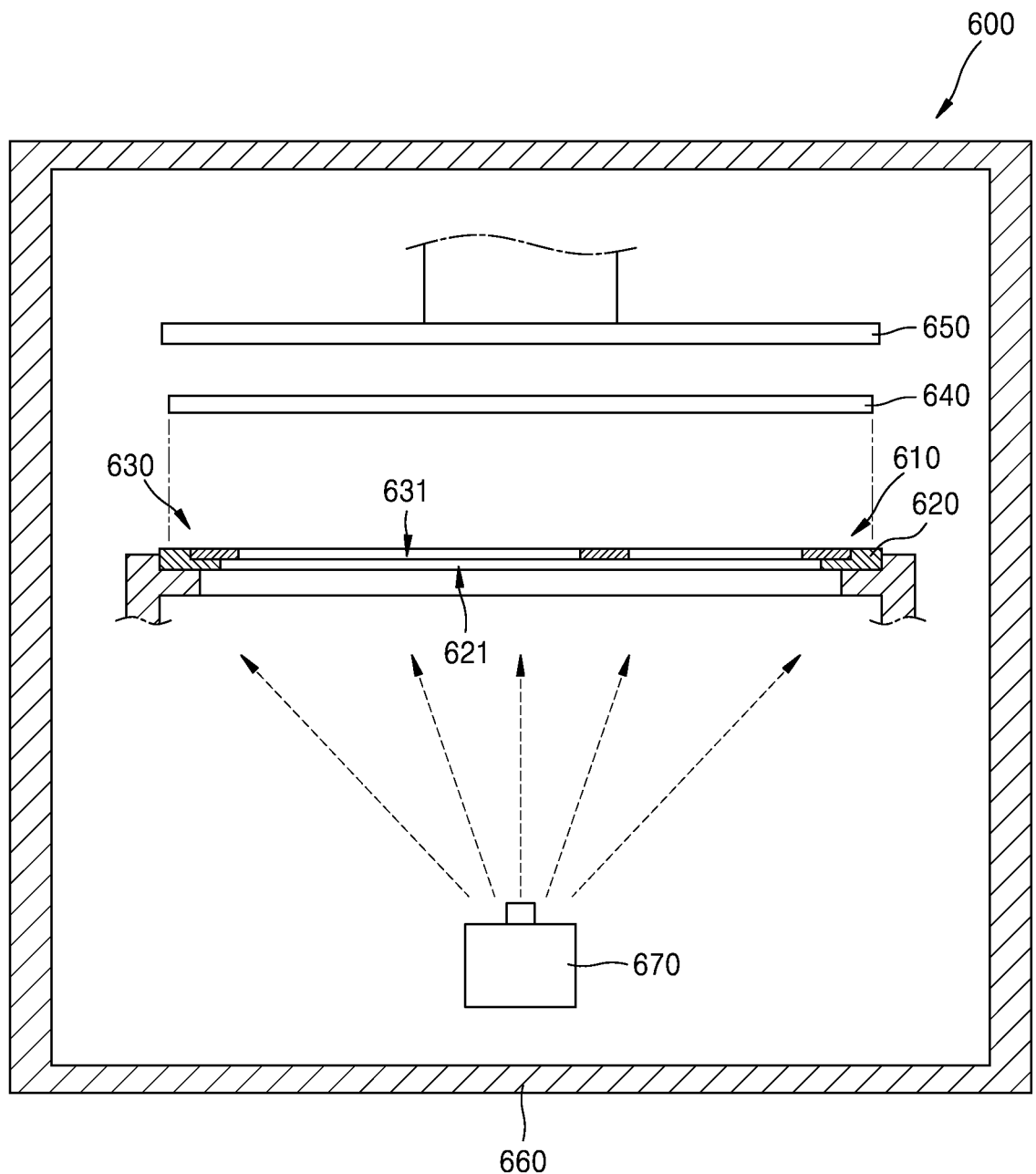
FIG. 6 is a view showing a configuration of a deposition apparatus according to an embodiment.

FIG. 6 is a view showing a configuration of a deposition apparatus 600 according to an embodiment.

Referring to FIG. 6, the deposition apparatus 600 includes a vacuum chamber 660 for depositing a common electrode or a common layer such as a partial layer of an intermediate layer of an organic light-emitting display device.

A deposition source 670 may be located in a bottom portion inside the vacuum chamber 660. A mask frame assembly 610 may be positioned over the deposition source 670. The mask frame assembly 610 includes a mask frame 620 and a mask stick 630. The mask stick 630 may be a hybrid type and positioned on the mask frame 620. A plurality of openings 631 corresponding to a plurality of deposition areas for simultaneously manufacturing a plurality of display panels may be arranged in the mask stick 630. A substrate 640 may be located over the mask stick 630. A magnet 650 that is configured to generate magnetic force to place the mask stick 630 in contact with the substrate 640 may be installed over the substrate 640 in preparation for a deposition process.

During the deposition process, a deposition material is sprayed from the deposition source 670 toward the mask stick 630, and the deposition material that progresses through the plurality of openings 631 of the mask frame 620 passes through the plurality of openings 631 formed in the mask stick 630 and is deposited on a surface of the substrate 640 that faces the deposition source 670.

Figure 7:
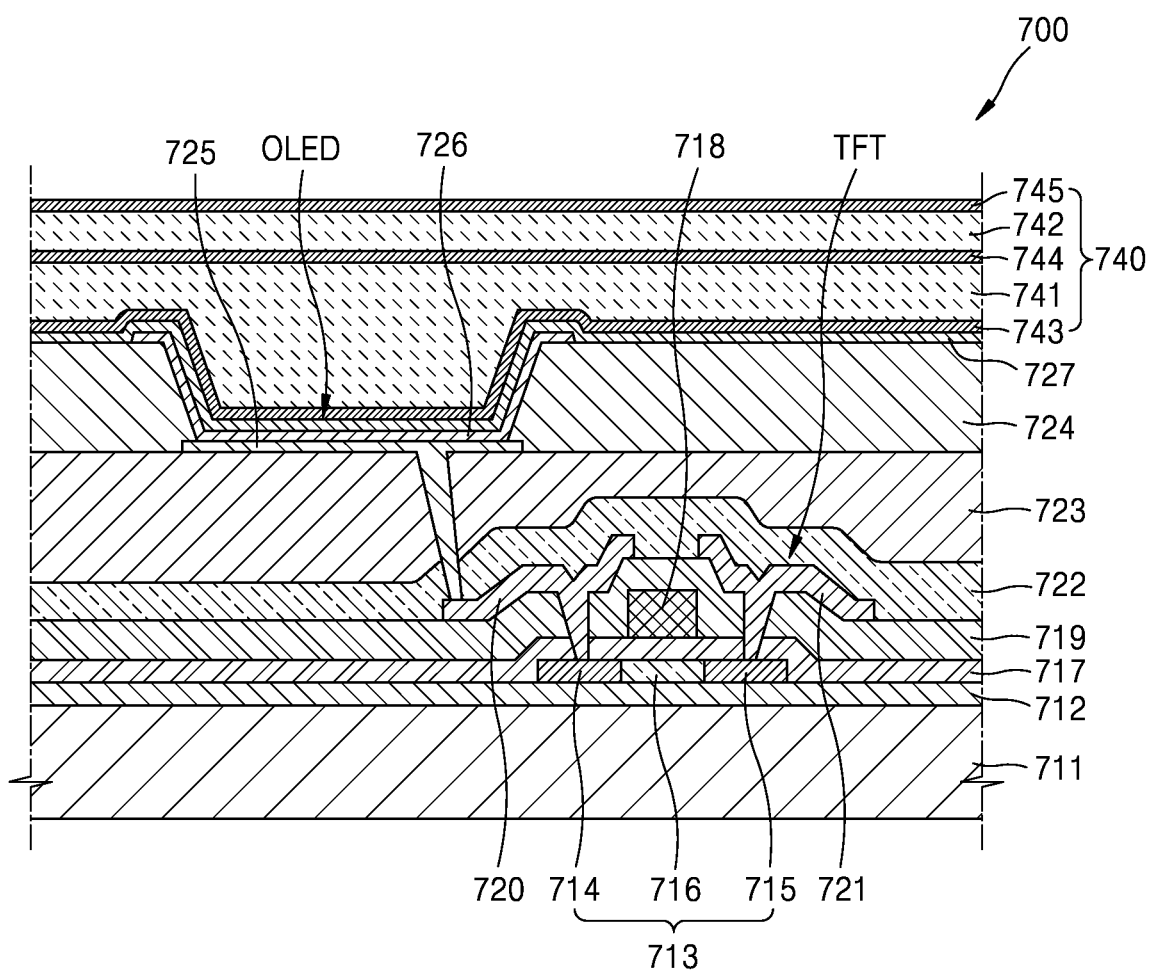
FIG. 7 is a cross-sectional view of one sub-pixel of an organic light-emitting display device according to an embodiment.

FIG. 7 is a cross-sectional view of one sub-pixel of an organic light-emitting display device 700 according to an embodiment.

The organic light-emitting display device 700 includes a plurality of sub-pixels, and each of the sub-pixels includes at least one thin film transistor TFT and an organic light-emitting diode OLED. The thin film transistor TFT may not have a structure shown in FIG. 7 and may be variously modified to have a different number of thin film transistors TFT and a different structure of the thin film transistors TFT without deviating from the scope of the present disclosure.

Referring to FIG. 7, the organic light-emitting display device 700 includes a substrate 711. The substrate 711 may include a glass substrate, a plastic substrate, or a flexible film substrate. The substrate 711 may be transparent, semi-transparent, or opaque.

A barrier layer 712 may be arranged on the substrate 711. The barrier layer 712 may cover a top surface of the substrate 711. The barrier layer 712 may include an inorganic layer or an organic layer. The barrier layer 712 may be a single layer or a multi-layer.

The thin film transistor TFT may be arranged on the barrier layer 712. Although a top-gate type thin film transistor is exemplarily shown as the thin film transistor TFT according to the present embodiment, a thin film transistor having a different structure such as a bottom-gate type thin film transistor may be provided without deviating from the scope of the present disclosure.

A semiconductor active layer 713 may be arranged on the barrier layer 712. A source region 714 and a drain region 715 may be formed in the semiconductor active layer 713 by doping the semiconductor active layer 713 with N-type or P-type impurities. A region between the source region 714 and the drain region 715 may correspond to a channel region 716 that is not doped with impurities.

The semiconductor active layer 713 may be an organic semiconductor layer, an inorganic semiconductor layer, or amorphous silicon layer. In another embodiment, the semiconductor active layer 713 may be an oxide semiconductor layer.

A gate insulating layer 717 may be deposited on the semiconductor active layer 713. The gate insulating layer 717 may include an inorganic material. The gate insulating layer 717 may be a single layer or a multi-layer.

A gate electrode 718 may be arranged on the gate insulating layer 717. The gate electrode 718 may include a single layer or a multi-layer including Au, Ag, Cu, Ni, Pt, Pd, Al, Mo, and Cr, or an alloy of Al: Nd and Mo: W.

An interlayer insulating layer 719 may be arranged on the gate electrode 718. The interlayer insulating layer 719 may include an inorganic layer including silicon oxide or silicon nitride.

A source electrode 720 and a drain electrode 721 may be arranged on the interlayer insulating layer 719. Contact holes may be formed by removing a portion of the gate insulating layer 717 and a portion of the interlayer insulating layer 719. The source electrode 720 may be electrically connected to the source region 714 through one of the contact holes, and the drain electrode 721 may be electrically connected to the drain region 715 through the other of the contact holes.

A passivation layer 722 may be formed on the source electrode 720 and the drain electrode 721. The passivation layer 722 may include an inorganic layer or an organic layer.

A planarization layer 723 may be formed on the passivation layer 722. The planarization layer 723 may include an organic layer including acryl, polyimide, or benzocyclobutene (BCB).

An organic light-emitting diode OLED may be arranged over the thin film transistor TFT.

The organic light-emitting diode OLED includes a first electrode 725, a second electrode 727, and an intermediate layer 726 interposed between the first electrode 725 and the second electrode 727.

The first electrode 725 is electrically connected to one of the source electrode 720 and the drain electrode 721 through a contact hole. The first electrode 725 may correspond to a pixel electrode.

The first electrode 725 may serve as an anode and include various conductive materials. The first electrode 725 may include a transparent electrode or a reflective electrode.

A pixel-defining layer (PDL) 724 covering edges of the first electrode 725 of the organic light-emitting diode OLED may be arranged on the planarization layer 723. The PDL 724 defines an emission region of each sub-pixel by surrounding the edges of the first electrode 725. The pixel-defining layer 724 may include an organic layer.

The intermediate layer 726 may be arranged on a region of the first electrode 725 that is exposed by etching a portion of the pixel-defining layer 724. The intermediate layer 726 may be formed by a deposition process.

The intermediate layer 726 may include a low molecular or polymer organic material.

The intermediate layer 726 may include an organic emissive layer (EML). In an embodiment, the intermediate layer 726 may include the organic EML and further include at least one of a hole injection layer (HIL), a hole transport layer (HTL), an electron transport layer (ETL), and an electron injection layer (EIL). It is understood that the present embodiment is not limited thereto, and the intermediate layer 726 may include the organic EML and further include other various functional layers.

In an embodiment, the organic EML may be arranged in each sub-pixel.

The HIL, the HTL, the ETL, and the EIL may serve as common layers and extend over adjacent sub-pixels. The HIL, the HTL, the ETL, and the EIL may be deposited by using a hybrid mask stick according to an embodiment.

The second electrode 727 may be arranged on the intermediate layer 726. The second electrode 727 may correspond to a common electrode. Similar to the first electrode 725, the second electrode 727 may include a transparent electrode or a reflective electrode. The second electrode 727 may be deposited by using a hybrid mask stick according to an embodiment.

The first electrode 725 may be insulated from the second electrode 727 by the intermediate layer 726. When a voltage is applied to the first electrode 725 and the second electrode 727, the intermediate layer 726 emits visible light corresponding to a sub-pixel of an image recognizable by a user.

An encapsulation layer 740 may be arranged on the organic light-emitting diode OLED.

The encapsulation layer 740 may include a plurality of organic layers 741 and 742, and a plurality of inorganic layers 743, 744, and 745 that are stacked onto one another. In an embodiment, the encapsulation layer 740 may have a structure including the organic layers 741 and 742 that have at least one story, and the inorganic layers 743, 744, and 745 that have at least two stories. To prevent passage of moisture through the organic light-emitting diode OLED, an uppermost layer 745 of the encapsulation layer 740 that is externally exposed may include an inorganic layer.

A hybrid mask stick and a mask frame assembly employing the same according to an embodiment may prevent deformation of a portion where a plurality of mask sticks is coupled to one another. Therefore, deposition areas that are defined by the plurality of mask sticks may be accurately defined.

While one or more embodiments of the present disclosure have been described with reference to the figures, it will be understood by those of ordinary skill in the art that various changes and deviations in form and details may be made therein without departing from the spirit and scope of the present disclosure as defined by the following claims.

What is claimed is:

1. A mask frame assembly comprising:
    a mask frame including an opening;
    a mask stick assembly arranged on the mask frame and including at least one first mask stick that extends in a first direction, at least one second mask stick that extends in a second direction intersecting the first direction, and a plurality of third mask sticks that is coupled to ends of each of the at least one first mask stick and the at least one second mask stick and defines a plurality of deposition areas,
    wherein a thickness of each of the at least one first mask stick is different from a thickness of each of the at least one second mask stick, and a partial etching portion is arranged at a portion where the at least one first mask stick and the at least one second mask stick are coupled to each other,
    wherein each of the at least one first mask stick includes a first stick member and a second stick member that is arranged on and overlaps the first stick member, and the partial etching portion is arranged in a portion where the second stick member and the at least one second mask stick are coupled to each other, and
    wherein the partial etching portion comprises:
    a first partial etching portion arranged in the second stick member and having a thickness that is smaller than a thickness of other portions of the second stick member; and
    a second partial etching portion arranged in each of the at least one second mask stick and having a thickness that is smaller than a thickness of other portions of the at least one second mask stick.

2. The mask frame assembly of claim 1, wherein the first stick member is a stick member that is coupled to the at least one second mask stick, the second stick member is a stick member that defines the plurality of deposition areas, and a thickness of the first stick member is greater than a thickness of the second stick member.

3. The mask frame assembly of claim 2,
    wherein the first partial etching portion and the second partial etching portion have shapes corresponding to each other and are coupled to each other in a third direction intersecting the first direction and the second direction.

4. The mask frame assembly of claim 3, wherein a sum of a thickness of the first partial etching portion and a thickness of the second partial etching portion is same as a thickness of other portions of the second stick member.

5. The mask frame assembly of claim 2, wherein a width of the second stick member is greater than a width of the first stick member.

6. The mask frame assembly of claim 2, wherein the at least one second mask stick is welded onto the first stick member, and the second stick member is welded onto the at least one second mask stick.

7. A hybrid mask stick comprising:
    at least one first mask stick that extends in a first direction;
    at least one second mask stick that extends in a second direction intersecting the first direction; and
    a plurality of third mask sticks coupled to ends of the at least one first mask stick and the at least one second mask stick,
    wherein the at least one first mask stick, the at least one second mask stick, and the plurality of third mask sticks are coupled to one another and define a plurality of deposition areas corresponding to a plurality of display panels, and a partial etching portion is arranged in a portion where the at least one first mask stick and the at least one second mask stick are coupled to each other,
    wherein each of the at least one first mask stick includes a first stick member and a second stick member that is arranged on the first stick member, the partial etching portion is arranged in a portion where the second stick member and the at least one second mask stick are coupled to each other, and a thickness of the second stick member is smaller than a thickness of the first stick member, and
    wherein the partial etching portion comprises:
    a first partial etching portion arranged in the second stick member and having a thickness that is smaller than a thickness of other portions of the second stick member; and
    a second partial etching portion arranged in each of the at least one second mask stick and having a thickness that is smaller than a thickness of other portions of the at least one second mask stick.

* * * * *